(12) United States Patent
Enda

(10) Patent No.: US 8,344,510 B2
(45) Date of Patent: Jan. 1, 2013

(54) SEMICONDUCTOR DEVICE WITH VOID DETECTION MONITOR

(75) Inventor: Takayuki Enda, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/043,383

(22) Filed: Mar. 8, 2011

(65) Prior Publication Data
US 2011/0156036 A1    Jun. 30, 2011

Related U.S. Application Data

(62) Division of application No. 12/240,767, filed on Sep. 29, 2008, now Pat. No. 7,901,954.

(30) Foreign Application Priority Data

Sep. 28, 2007 (JP) ................................. 2007-254536

(51) Int. Cl.
*H01L 23/48* (2006.01)
(52) U.S. Cl. .... 257/751; 257/48; 257/758; 257/E23.151
(58) Field of Classification Search ............... 257/48, 257/752, 758, E23.151; 438/16
See application file for complete search history.

(56) References Cited

U.S. PATENT DOCUMENTS

| | | | |
|---|---|---|---|
| 5,900,645 A * | 5/1999 | Yamada | 257/48 |
| 6,159,756 A | 12/2000 | Yamada | |
| 6,210,980 B1 | 4/2001 | Matsuda | |
| 7,074,626 B2 | 7/2006 | Parikh et al. | |
| 7,262,066 B2 | 8/2007 | McNamara et al. | |
| 7,491,555 B2 * | 2/2009 | Lehr et al. | 438/14 |
| 7,679,083 B2 * | 3/2010 | Sun et al. | 257/48 |
| 2004/0026693 A1 * | 2/2004 | McLaughlin et al. | 257/48 |
| 2005/0112788 A1 * | 5/2005 | Borden et al. | 438/14 |
| 2009/0066358 A1 | 3/2009 | Smayling et al. | |

* cited by examiner

*Primary Examiner* — Tuan N. Quach

(57) ABSTRACT

Methods for detecting a void in an element portion of a semiconductor device having an element portion and a void detection structure are disclosed. As a part of the method, an insulating film is formed on a substrate, a plurality of holes is formed in the insulating film, and a metal portion is formed on the insulating film to fill the plurality of holes. The metal portion is polished until the insulating film is exposed and a recessed portion is formed in the void detection structure. It is determined if a void exists in the element portion of the semiconductor device by determining whether or not a void is exposed at a surface of the recessed portion of the void detection structure.

13 Claims, 12 Drawing Sheets

SEMICONDUCTOR DEVICE WITH VOID DETECTION MONITOR

RELATED APPLICATIONS

This application is a divisional of U.S. patent application Ser. No. 12/240,767, entitled "Method for Detecting a Void", filed Sep. 29, 2008, U.S. Pat. No. 7,901,954, which claims priority to Japanese Patent Application 2007-254536 entitled "Semiconductor Device and Method for Manufacturing thereof" filed Sep. 28, 2007 which are hereby incorporated herein by reference in their entirety.

TECHNICAL FIELD

The invention relates to a semiconductor device and a manufacturing method therefor.

BACKGROUND

Recently, multi-layered interconnection structures have been increasingly used to support trends related to the miniaturization and high integration of semiconductor devices. Copper (Cu) interconnections that possess low electrical resistivity have been used for the purpose of preventing propagation delay of signals that flow through the interconnections. The Cu interconnections may be produced through a damascene process.

Cu interconnections formed using damascene processes are buried in very fine structures where voids may be formed therein. A void inside the Cu interconnection adversely affects the reliability of the Cu interconnection, and can cause the disconnection of the Cu interconnection and/or an increase in the interconnection resistance. The detection of the void formed inside the Cu interconnection is thus highly desirable (see Japanese Patent Application Publication No. JP-A-H8-255818).

Conventional void detection methodologies include potential contrast failure detection and optical measurement detection. As it regards potential contrast failure detection, using this approach electron beams are irradiated on the substrate surface to detect the discharge volume of the secondary electrons, which depends on the conduction state of the Cu interconnection such that a void that is formed inside the Cu interconnection is detected. Referring to FIG. 1, in cases where a void 10 is formed inside a Cu interconnection 13 in a $SiO_2$ film 18 and acts to interrupt the conduction state of the Cu interconnection 13 completely, that is, it is brought into the electrically open state, the void 10 may be detected.

Referring to FIG. 2, as it regards optical measurement, when a void 10 is exposed to the surface of the Cu interconnection as shown in FIG. 2, it may be readily detected using optical measurement detection. A detection problem is presented when a void 10 is formed inside a Cu interconnection 13 and the conducting state of the Cu interconnection 13 is not completely interrupted. In this ease, the void 10 cannot be detected by potential contrast failure detection. Moreover, as the void 10 is not exposed to the surface of the Cu interconnection 13, it also cannot be detected through the use of optical measurement detection. Consequently, a semiconductor device having an undetected void 10 as shown in FIG. 3 may be defective in a final reliability evaluation due to stress migration and electro-migration caused by the void 10. The ability to detect voids such as is shown in FIG. 2 is thus highly desirable.

SUMMARY OF THE INVENTION

It is an object of the invention to provide a semiconductor device that is capable of detecting a void which is formed inside a semiconductor device interconnection.

In one embodiment, a method for detecting a void in an element portion of a semiconductor device having an element portion and a void detection structure is disclosed. As a part of the method, an insulating film is formed on a substrate, a plurality of holes is formed in the insulating film, and a metal portion is formed on the insulating film to fill the plurality of holes. The metal portion is polished until the insulating film is exposed and a recessed portion is formed in the void detection structure. It is determined if a void exists in the element portion of the semiconductor device by determining whether or not a void is exposed at a surface of the recessed portion of the void detection structure.

According to another embodiment of the present invention, there is provided a semiconductor device that includes an element portion and a void detection monitor, which includes an insulating film formed on a substrate, and a plurality of metal portions each extending through the insulating film. The void detection monitor has a dish-like recess portion, and is different in shape from the element portion. The dish-like recess portion that is formed in the void detection monitor facilitates the detection of a void that is formed in the metal portion of the element portion of the semiconductor device.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

A semiconductor device and a method for manufacturing such a device that is capable of detecting a void formed inside the interconnection is described hereinafter. As a part of the description, "dishing" and erosion which may occur in the course of forming a metal portion of such a device through a damascene process will be described. In one embodiment, the metal portion is formed through a damascene process which includes: (1) forming an insulating film on the substrate, (2) forming a hole in the insulating film, (3) forming a metal portion on the insulating film so as to fill the hole in the insulating film, and (4) polishing the metal portion on the insulating film such that it is left in the hole and such that the surface of the insulating film is exposed.

In one embodiment, the metal portion is polished through a Chemical Mechanical Polishing (CMP) process. This may deteriorate flatness depending on the polishing agent, the polishing device and the property of the insulating film to be used. The deterioration in the flatness is generally referred to as "dishing" and "erosion." Dishing denotes a phenomenon where a dish-like recess is generated in the metal portion when the line width of the metal portion is large. Erosion denotes a phenomenon where the insulating film is cut together with the metal portion when the line width of the metal portion is small. Hereinafter, both dishing and the erosion will be referred to as dishing.

Exemplary Device and Manufacturing Methods

Figure 4:
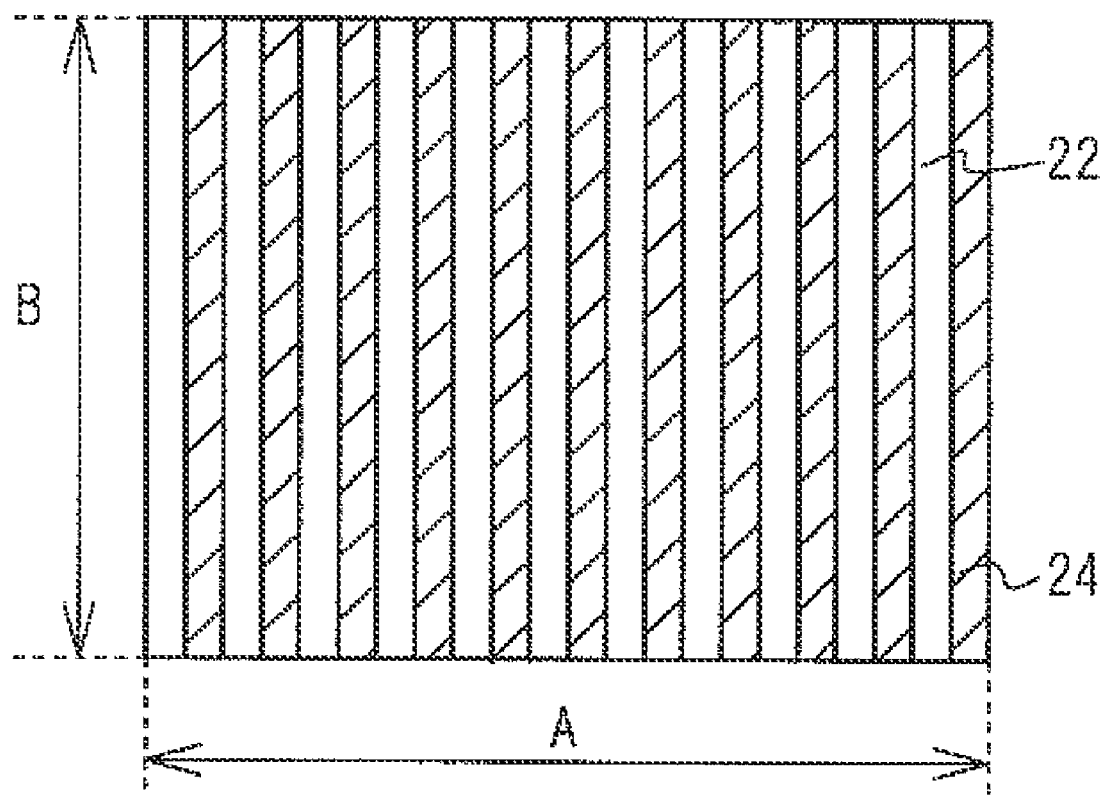
FIG. 4 is a top view showing a pattern used to measure a dishing amount according to one embodiment.
Figure 5A:
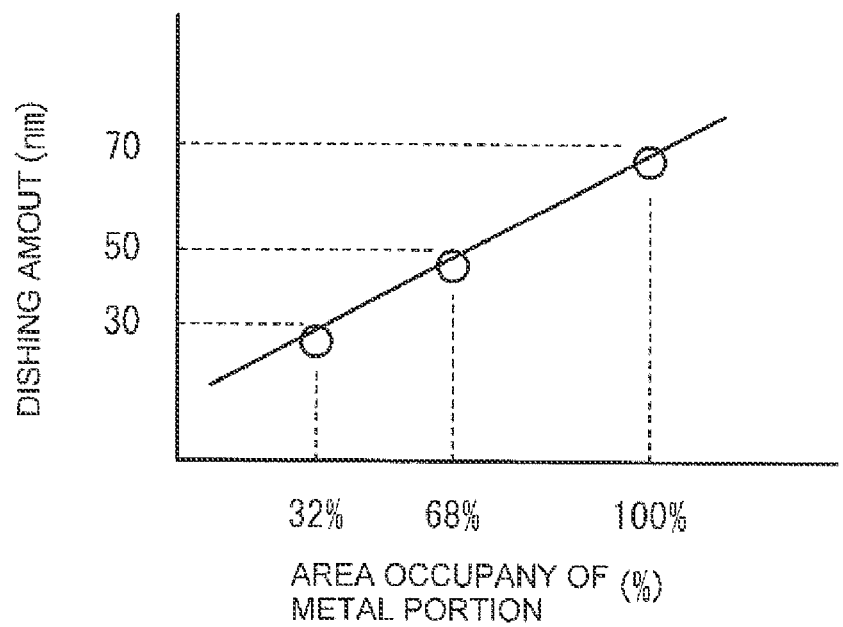
FIG. 5A is a graph that shows the relationship between a change in the dishing amount and a change in the area occupancy of the metal portion when the pattern shown in FIG. 4 has a size of 80 um×80 um according to one embodiment.
Figure 5B:
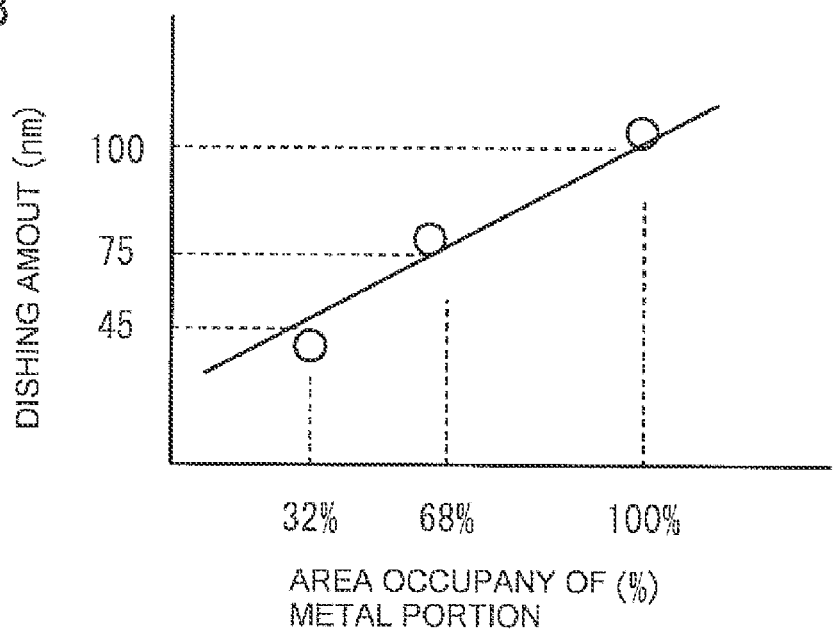
FIG. 5B is a graph that shows the relationship between a change in the dishing amount and a change in the area occupancy of the metal portion when the pattern shown in FIG. 4 has a size of 1500 um×1500 um according to one embodiment.

Referring to FIG. 4, using a pattern having metal portions 24 and insulating films 22 alternately arranged, the amount of the dishing caused in the CMP process is changed by changing the area occupancy of the metal portions 24 with respect to the pattern area. In the FIG. 4 embodiment, the line width of the metal portion 24 ranges from 0.1 um to 0.2 um. FIG. 5A shows the change in the dishing amount that accompanies a change in the area of occupancy of the metal portions 24 when the pattern area (A×B) is 80 um×80 um. FIG. 5B shows the change in the dishing amount that accompanies a change in the area occupancy of the metal portions 24 when the pattern area (A×B) is 1500 um×1500 um. The dishing amount indicates the depth of the largest dish-like recess caused by the dishing.

Figure 1:
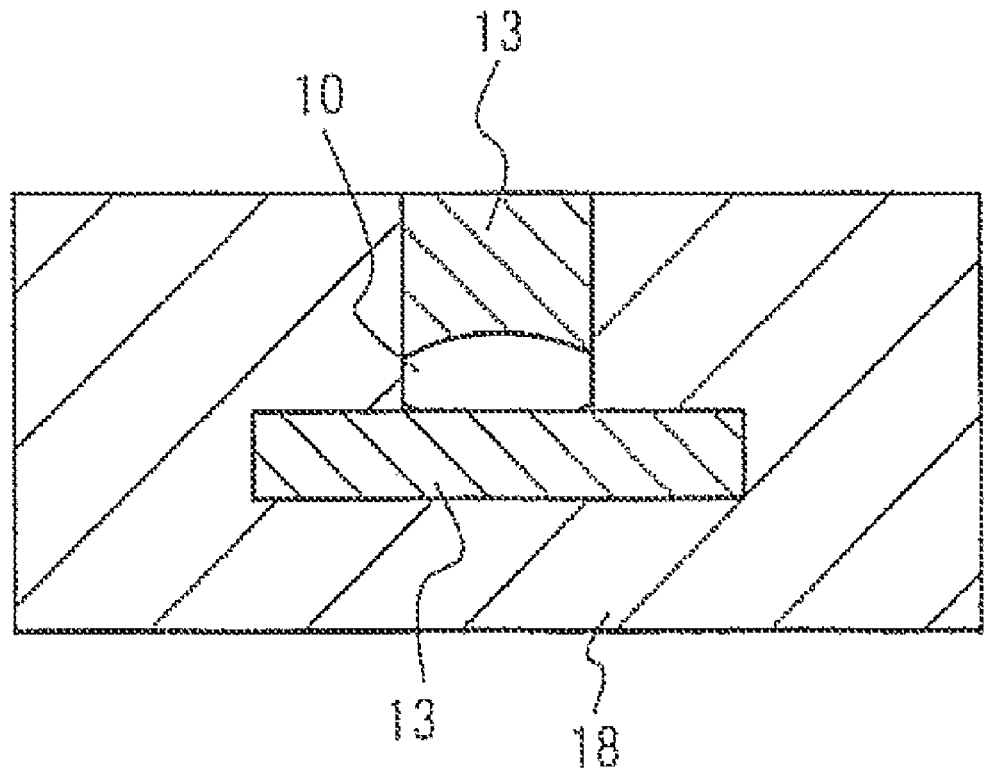
FIG. 1 is a sectional view of a portion of a device that has an interconnection with a void within it that is inspected using a conventional void inspection method.
Figure 2:
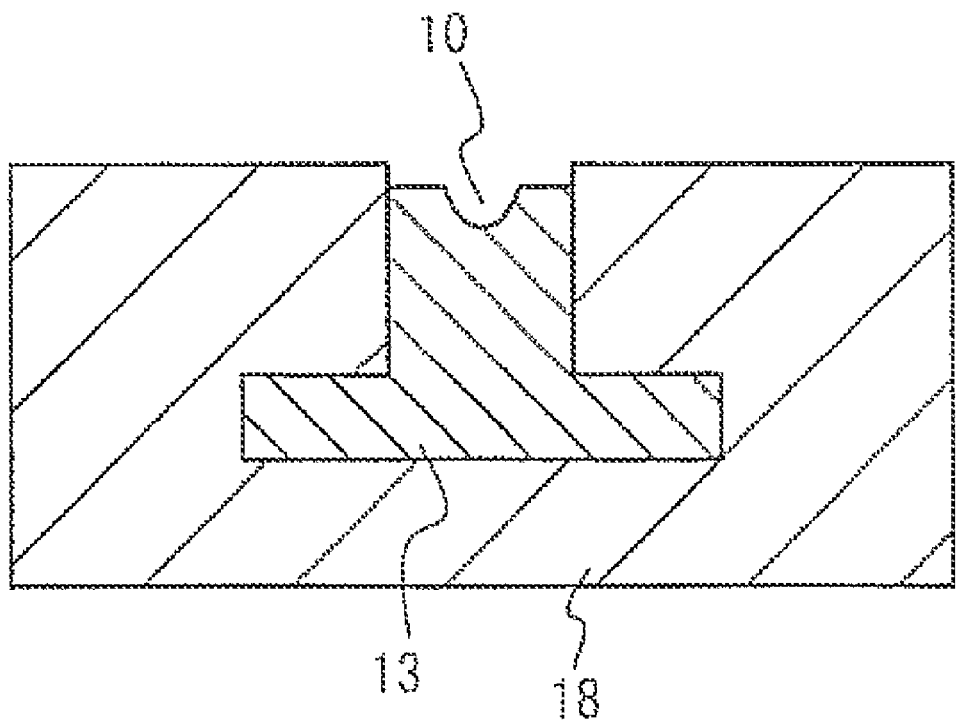
FIG. 2 is a sectional view of a portion of a device that has an interconnection with a void on it surface that is inspected using a conventional void inspection method.
Figure 3:
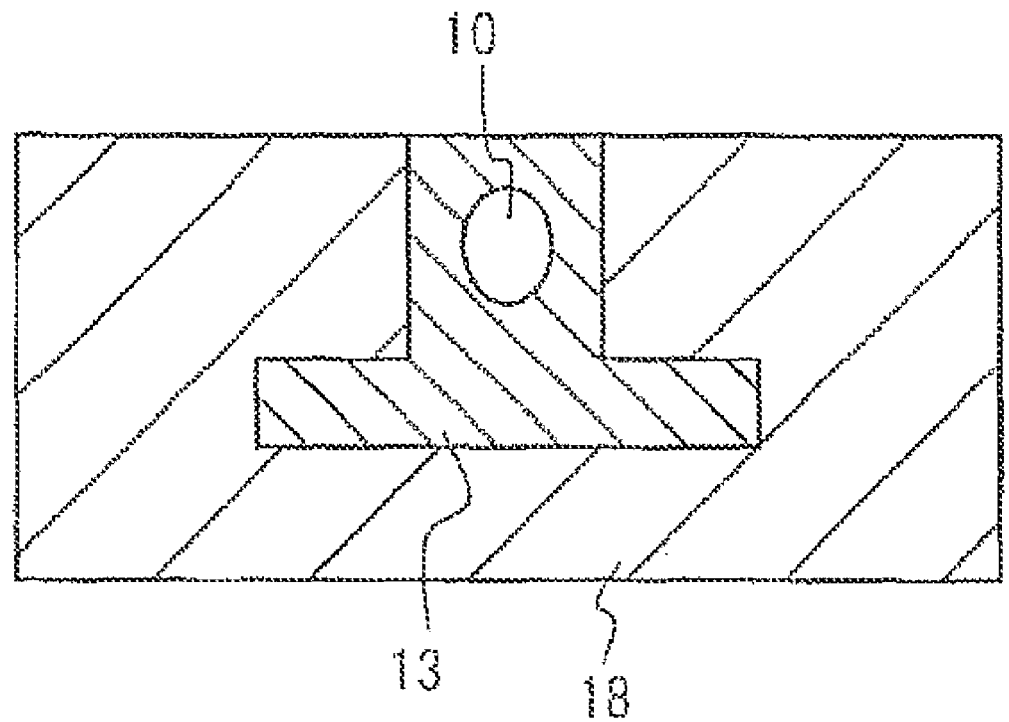
FIG. 3 is a sectional view illustrating a problem of a conventional method.

Referring to FIGS. 5A and 5B, graphs are shown where the x-axis indicates the area occupancy of the metal portions 24 to the pattern area, and the y-axis shows the dishing amount. Dishing amounts that correspond to area occupancies of the metal portions 24 of 32%, 68%, and 100%, respectively are shown. Each of the solid lines shown in FIGS. 5A and 5B provide an approximation of measured results. FIGS. 5A and 5B show that the dishing amount changes in accordance with a change in the area occupancy of the metal portion 24. In the case of an 80 um×80 um pattern such as is shown in FIG. 5A, the dishing amount was changed from 30 nm to 70 um based on a corresponding change in the area occupancy of the metal portions 24 of 32% to 100%. In the case of an 1500 um×1500 um pattern such as shown in FIG. 5B, the dishing amount was changed from 45 nm to 100 nm based on a corresponding change in the area occupancy of the metal portion 24 from 32% to 100%. Accordingly, in the aforementioned example, the dishing amount increases in proportion to the area occupancy of the metal portion 24. Herein below a description of a semiconductor device and a method for manufacturing such is provided, where such semiconductor device is capable of detecting a void (e.g., 10 in FIG. 3) inside the metal portion 24 based on correspondence of changes in dishing amount and area occupancy.

Exemplary Embodiments

Figure 6:
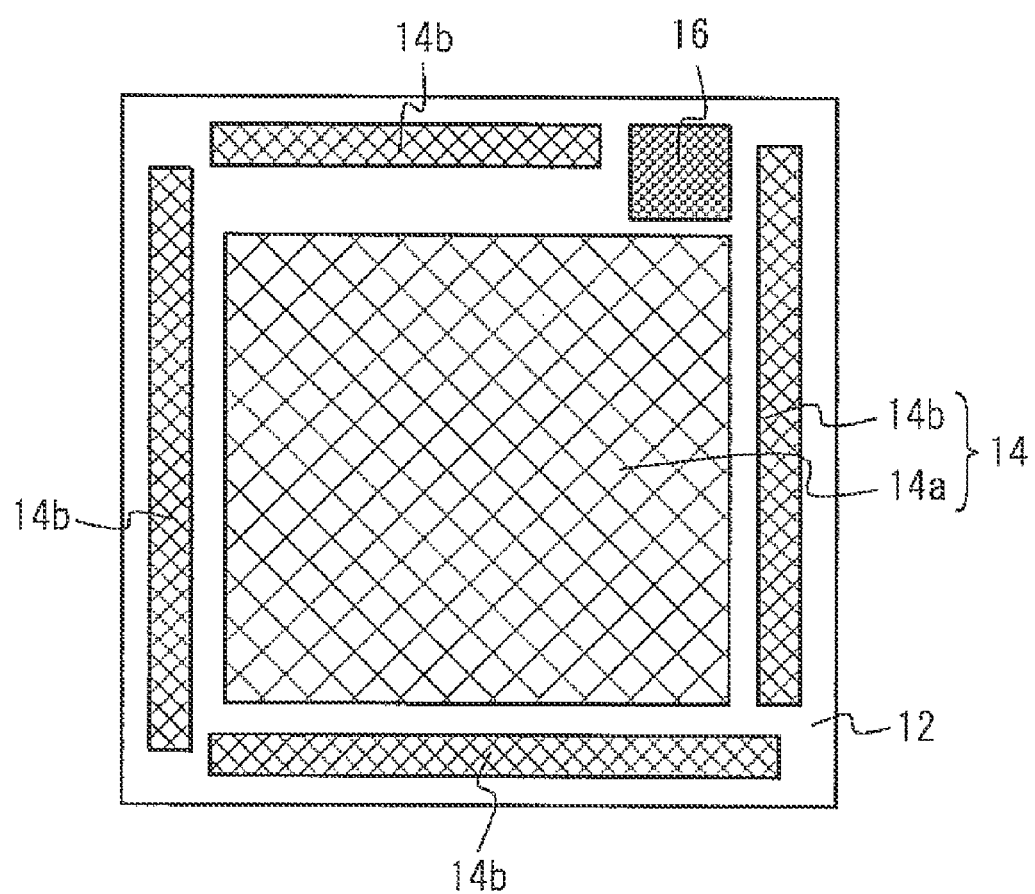
FIG. 6 is a top view that shows an element portion and a void detection monitor of a semiconductor device according to one embodiment.

FIG. 6 is a top view of an element portion of a semiconductor device (semiconductor chip) according to a first embodiment, having a void detection monitor disposed there around. Referring to FIG. 6, an element portion 14 formed of a memory cell region 14a and peripheral cell regions 14h is formed on a substrate 12. A void detection monitor 16 is formed on a region of the substrate 12 where the memory cell region 14a and the peripheral cell regions 14h are not formed, that is, an unoccupied region.

Figure 7A:
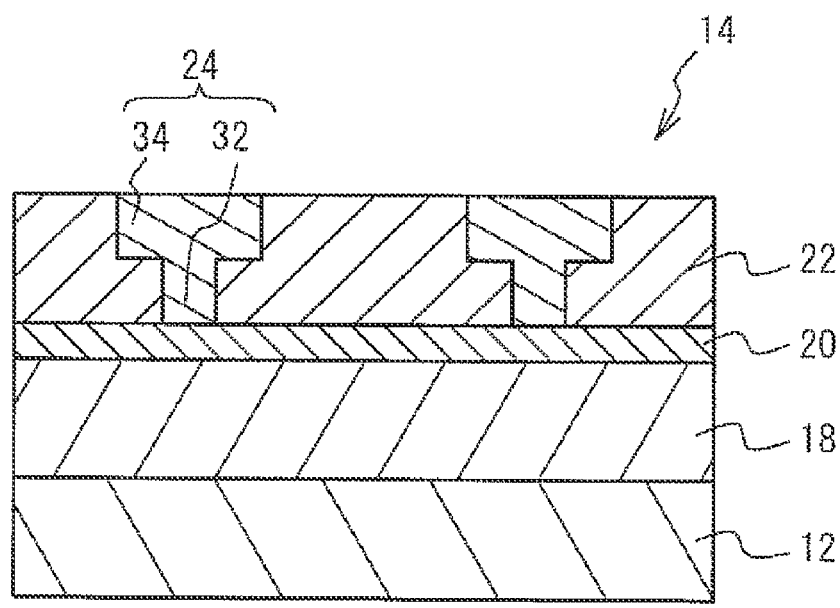
FIG. 7A is a sectional view of the metal portion of the element portion of a semiconductor device according to a first embodiment.
Figure 7B:
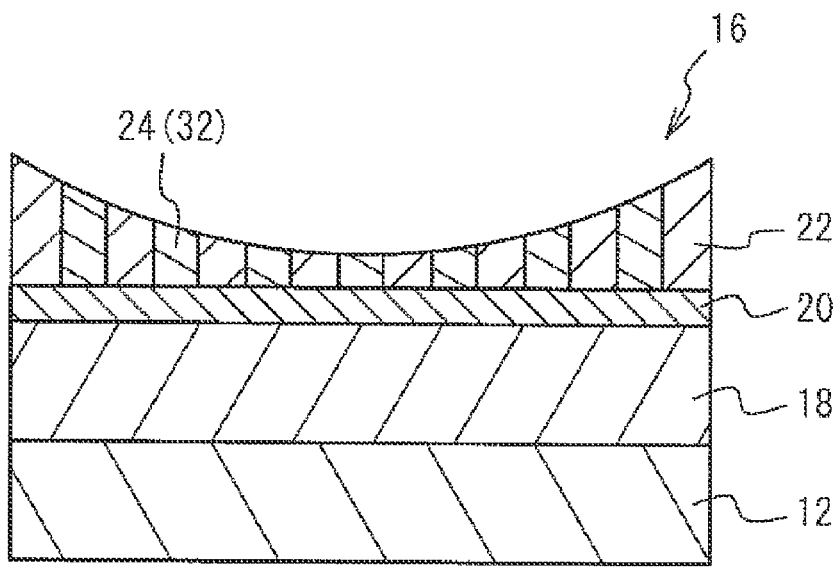
FIG. 7B is a sectional view of the metal portion of a void detection monitor of a semiconductor device according to a first embodiment.

FIG. 7A is a sectional view that shows the metal portion 24 of the element portion 14 shown in FIG. 6. FIG. 7B is a sectional view that shows the metal portion 24 of the void detection monitor 16. Referring to FIGS. 7A and 7B, an $SiO_2$ insulating film 22 serving as an inter-layer insulating film is formed on the substrate 12 (semiconductor substrate formed of Si in one embodiment) above an $SiO_2$ film 18 and an SiN film 20. The insulating film 22 has formed therein the metal portion 24, which may be formed of Cu, for example, and which pierces the insulating film 22. The metal portion 24 of the element portion 14 includes a via plug 32 and an interconnection layer 34 which constitute a dual damascene structure. In contrast, the metal portion 24 of the void detection monitor 16 includes a via plug 32 which constitutes a single damascene structure. Unlike the element portion 14, the void detection monitor 16 has a dish-like recess portion. The area occupancy of the total area viewed from the top of the metal portions 24 of the void detection monitor 16 to the area viewed from the top of the void detection monitor 16 is larger than the area occupancy of the total area viewed from the top of the metal portions 24 of the element portion 14 to the area viewed from the top of the element portion 14.

Figure 8A:
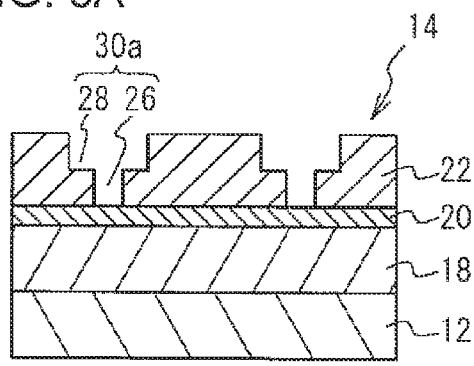
FIG. 8A is a sectional view that shows the resultant cross section of an element portion of a semiconductor device after one or more operations for forming a metal portion of the element portion of the semiconductor device according to the first embodiment.

The processes for manufacturing the metal portion 24 of the element portion 14 and the metal portion 24 of the void detection monitor 16 will be described with reference to FIGS. 8A to 8F. FIGS. 8A to 8C show cross-sectional views of the element portion 14 and FIGS. 8D to 8F show cross-sectional views of the void detection monitor 16.

Figure 8D:
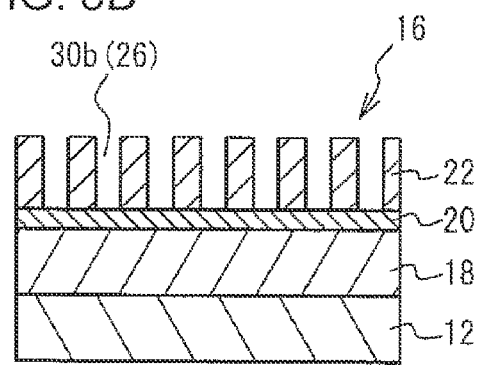
FIG. 8D is a sectional view that shows the resultant cross section of a void detection monitor of a semiconductor device after one or more operations for forming a metal portion of the void detection monitor of the semiconductor device according to the first embodiment.
Figure 8B:
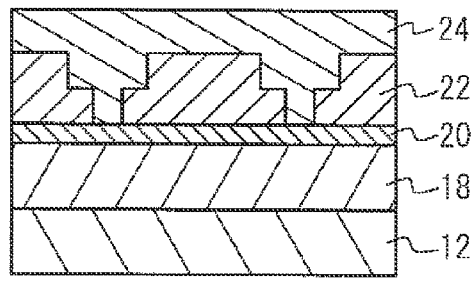
FIG. 8B is a sectional view that shows the resultant cross section of an element portion of a semiconductor device after one or more operations for forming a metal portion of the element portion of the semiconductor device according to the first embodiment.

Referring to FIGS. 8A and 8D, the $SiO_2$ film 18 and the SiN film 20 are formed on the substrate 12. In one embodiment the semiconductor substrate is formed of Si. The insulating film 22 of $SiO_2$ serves as an inter-layer insulating film and in one embodiment is formed on the SiN film 20 using a CVD (Chemical Vapor Deposition) process. Thereafter, an etching process is performed to form a hole 30a including a via hole 26 and an interconnection groove 28 in the insulating film 22 of the element portion 14, and a hole 30b including a via hole 26 in the insulating film 22 of the void detection monitor 16. In one embodiment holes, 30a and 30h, are formed such that the area occupancy of the total area viewed from the top of the holes 30b to the area viewed from the top of the void detection monitor 16 is larger than that of the total area viewed from the top of the holes 30a to the area viewed from the top of the element portion 14. There may be a case where the element portion 14 includes holes 30a that are excessively dense or sparse in distribution. In the aforementioned case, the area occupancy of the total area viewed from the top of the holes 30b to the area viewed from the top of the void detection monitor 16 is larger than that of the total area viewed from the top of the holes 30a in the dense region to the area viewed from the top of the holes 30a in the dense region.

Figure 8E:
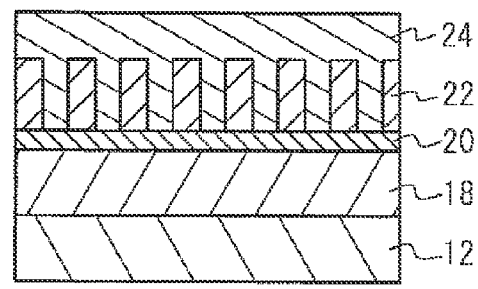
FIG. 8E is a sectional view that shows the resultant cross section of a void detection monitor of a semiconductor device after one or more operations for forming a metal portion of the void detection monitor of the semiconductor device according to the first embodiment.
Figure 8C:
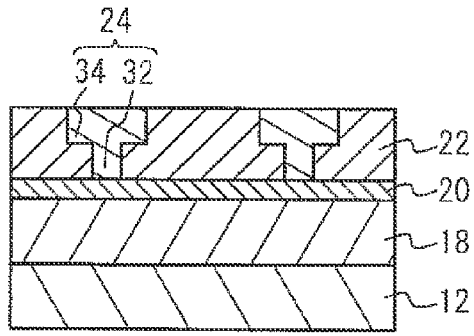
FIG. 8C is a sectional view that shows the resultant cross section of an element portion of a semiconductor device after one or more operations for forming a metal portion of the element portion of the semiconductor device according to the first embodiment.

Referring to FIGS. 8B and 8E, a barrier metal (not shown) and a Cu seed (not shown) are applied to the holes 30a and 30h using a sputtering (Physical Vapor Deposition) process to form the Cu metal portion 24 on the insulating film 22 so as to fill in the holes 30a and 30b through electrolytic plating (Electrochemical Deposition). As the area occupancy of the total area viewed from the top of the holes 30b to the area viewed from the top of the void detection monitor 16 is larger than that of the total area viewed from the top of the holes 30a to the area viewed from the top of the element portion 14, the area occupancy of the total area viewed from the top of the metal portions 24 filled in the holes 30b to the area viewed from the top of the void detection monitor 16 becomes larger than that of the total area viewed from the top of the metal portions 24 filled in the holes 30a to the area viewed from the top of the element portion 14 after forming the metal portion 24.

Figure 8F:
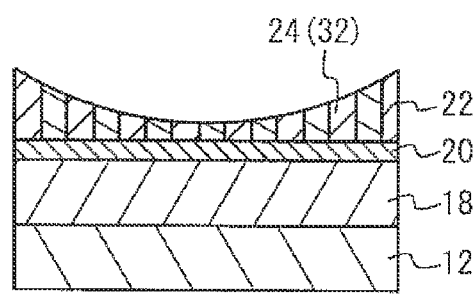
FIG. 8F is a sectional view that shows the resultant cross section of a void detection monitor of a semiconductor device after one or more operations for forming a metal portion of the void detection monitor of the semiconductor device according to the first embodiment.

Referring to FIGS. 8C and 8F, the metal portion 24 on the insulating film 22 is polished through a CMP process, for example, such that metal is left in the holes 30a and 30b, and the surface of the insulating film 22 is exposed. As the area occupancy of the total area viewed from the top of the metal portions 24 filled in the holes 30h to the area viewed from the top of the void detection monitor 16 is larger than that of the total area viewed from the top of the metal portions 24 filled in the holes 30a to the area viewed from the top of the element portion 14, the void detection monitor 16 possesses a degree of dishing that is larger than that of the element portion 14. Accordingly, void detection monitor 16 has a dish-like recess portion, and is different from the element portion 14 in shape. The metal portion 24 that fills the via hole 26 is referred to as a via plug 32, and the metal pardon 24 that fills the interconnection groove 28 is referred to as an interconnection layer 34.

Figure 9A:
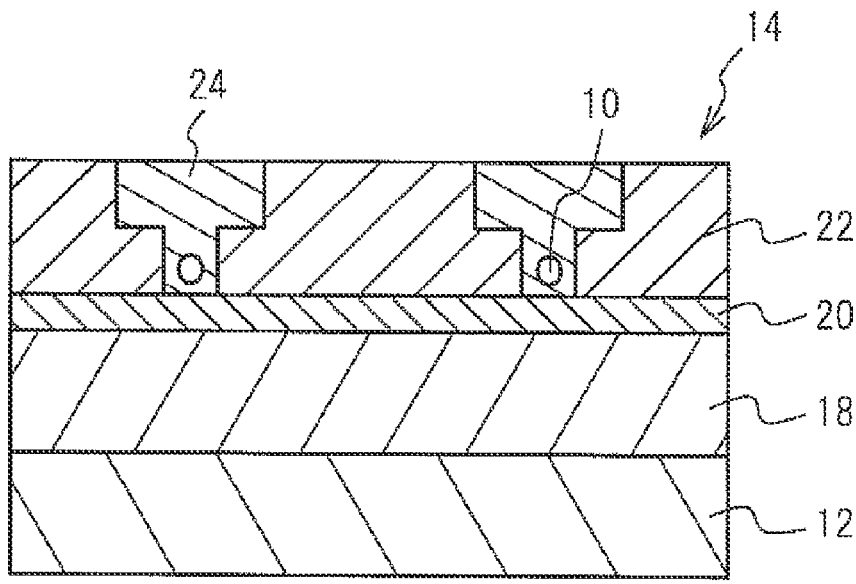
FIG. 9A is sectional view of an element portion of a semiconductor device that shows the location of voids that are formed inside metal portions of the element portion of the semiconductor device according to one embodiment.
Figure 9B:
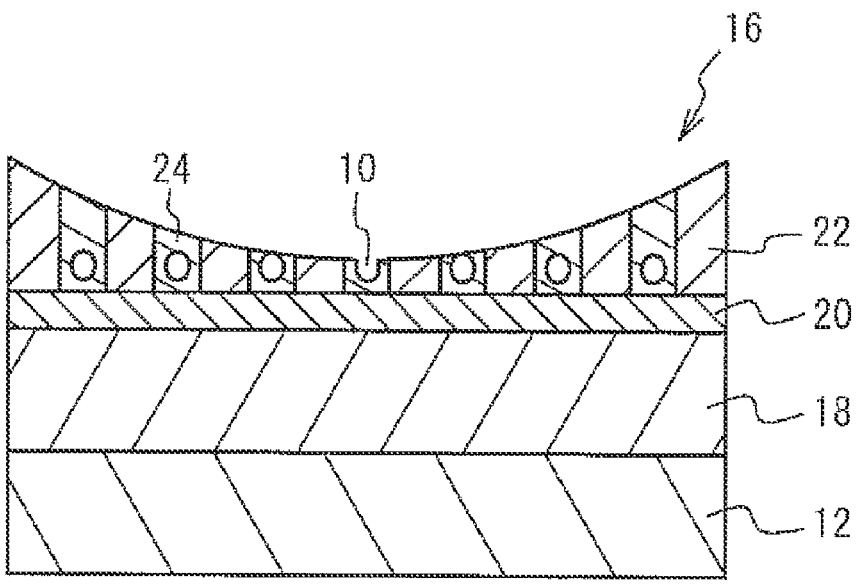
FIG. 9B is sectional view of a void detection monitor of a semiconductor device that shows the location of voids that are formed inside metal portions of the void detection monitor of the semiconductor device according to one embodiment.

Referring to FIG. 9A, in one embodiment, when a void 10 has formed inside the metal portion 24, the metal portion 24 of the element portion 14 appears as shown in FIG. 9A. It is therefore difficult to detect the void 10 using conventional techniques. As discussed above, it should be appreciated that the metal portion 24 of the void detection monitor 16 can develop a dish-like recess portion, through dishing associated with a polishing of the metal portion 24 (unlike the element portion 14). Referring to FIG. 9B, as it regards detection monitor 16, the void 10 formed inside the metal portion 24 may be exposed at the surface of the metal portion 24 as a result of polishing. Accordingly, in one embodiment, various optical measurement techniques may be used for detecting the void 10 in the void detection monitor 16. The void detection monitor 16 is, thus capable of revealing whether or not the void 10 is exposed at the surface of the void detection monitor 16 and to thereby determine whether a void 10 exists in a similar region of the metal portion 24 of the element portion 14.

As described with reference to FIGS. 5A and 511, when the area occupancy of the metal portion 24 is changed from 32% to 100% on a 80 um×80 um pattern, the dishing amount changes from 30 nm to 70 nm accordingly. When the area occupancy of the metal portion 24 is changed from 32% to 100% on a 1500 um×1500 um pattern, the dishing amount changes from 45 nm to 100 nm accordingly. Even on the 80 um×80 um pattern which is smaller than the 1500 um×1500 um pattern, the dishing amount may be sufficiently changed by adjusting the area occupancy of the metal portion 24. Accordingly, in one embodiment, the largely recessed dish-like portion may be formed only in the void detection monitor 16 while the flatness of the element portion 14 is maintained by making the area occupancy of the total area viewed from the top of the metal portions 24 formed in the void detection monitor 16 to the area viewed from the top of the void detection monitor 16 larger than that of the total area viewed from the top of the metal portions 24 formed in the element portion 14 to the area viewed from the top of the element portion 14. In one embodiment, an 80 um×80 um area is substantially the same as that of the unoccupied region on the substrate 12 as shown in FIG. 6. Conventional, semiconductor devices use a dummy pattern on the unoccupied region. In one embodiment, the unoccupied region can be occupied by the void detection monitor 16 instead of a dummy pattern.

As described with reference to FIG. 5A, when the area occupancy of the metal portion 24 of the void detection monitor 16 with a 80 um×80 um pattern is set to 32%, the dishing amount of the void detection monitor 16 becomes approximately 30 nm. Accordingly, the existence of the void 10 at a depth of 30 nm from the surface of the metal portion 24 with the dishing amount of 0 nm may be detected (in element portion 14). When the area occupancy of the metal portion 24 is set to 68%, the dishing amount of the void detection monitor 16 becomes approximately 50 nm. Accordingly, the existence of the void 10 to the depth of 50 nm from the surface of the metal portion 24 with the dishing amount of 0 nm may be detected.

Figure 10A:
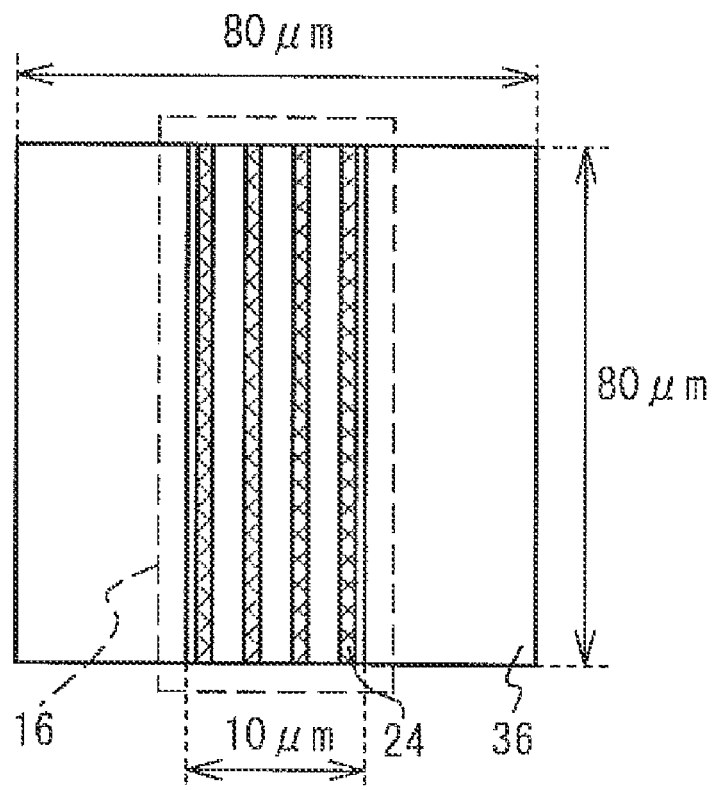
FIG. 10A is a top view representing an effect of a Cu film formed around the void detection monitor according to one embodiment.
Figure 10B:
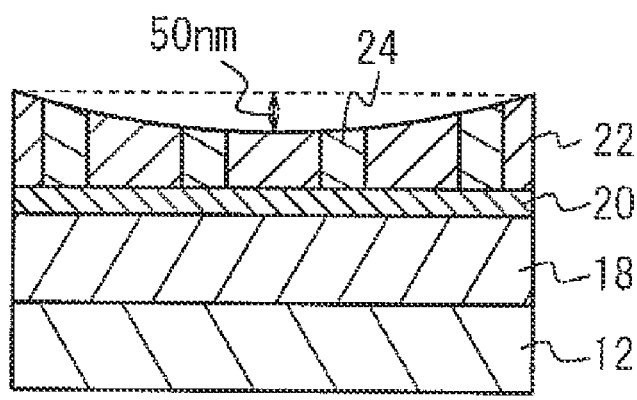
FIG. 10B is a sectional view of the void detection monitor shown in FIG. 10A according to one embodiment.
Figure 11A:
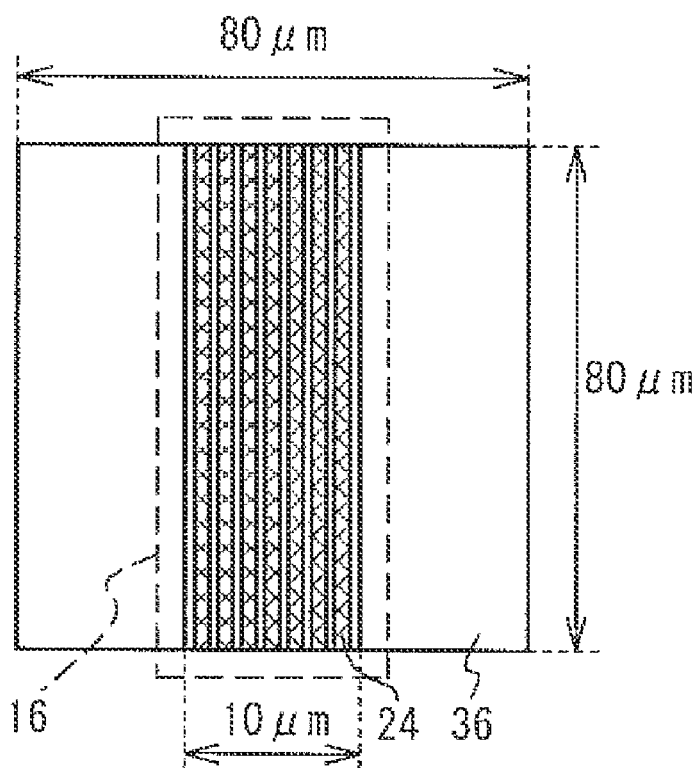
FIG. 11A is a top view that shows a Cu film formed around the void detection monitor according to one embodiment.
Figure 11B:
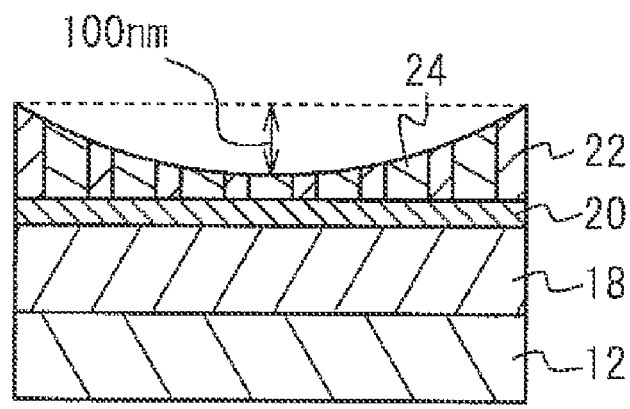
FIG. 11B is a sectional view of the void detection monitor shown in FIG. 11A according to one embodiment.

In one embodiment as shown in FIGS. 10A and 11A, a 10 um×80 um void detection monitor 16 is formed on the 80 um×80 um pattern region, and a Cu film 36 is formed on the pattern region other than the region occupied by the void detection monitor 16 such that the dishing amount may further be increased. For example, as shown in FIGS. 10A and 10B, when the area occupancy of the metal portion 24 of the void detection monitor 16 is set to 32%, the dishing amount may be set to approximately 50 nm. This makes it possible to detect the existence of the void 10 to the depth of 50 nm from the surface of the metal portion 24 with a dishing amount of 0 nm. As FIGS. 11A and 11B show, when the area occupancy of the metal portion 24 of the void detection monitor 16 is set to 68%, the dishing amount may be set to approximately 100 nm. In one embodiment, this enables the detection of the void 10 to the depth of 100 nm from the surface of the metal portion 24 with a dishing amount of 0 nm.

As described with reference to FIGS. 5A and 5B, the dishing amount may be changed by changing the area occupancy of the metal portion 24. In one embodiment, if the position inside the metal portion 24 where the void 10 is likely to be formed may be preliminarily estimated, the area occupancy of the metal portion 24 may be set based on the estimated position such that a void lying at the estimated position is exposed to the surface of the metal portion 24 through dishing in the void detection monitor 16.

As described with reference to FIGS. 5A to 5F, the void detection monitor 16 may be produced through the same process that is used to form the element portion 14. That is, the void detection monitor 16 does not have to be produced in a different process. Accordingly, cost increases and/or process complexity that can result from the use of additional manufacturing steps are avoided.

Referring again to FIGS. 7A and 7B, in the first embodiment, the metal portion 24 of the element portion 14 includes a via plug 32 and an interconnection layer 34, and the metal portion 24 of the void detection monitor 16 includes a via plug 32. That is, the metal portion 24 of the element portion 14 has a different cross-section as compared to that of the metal portion 24 of the void detection monitor 16. However, the invention is not limited to the aforementioned structure. For example, in an alternate embodiment in the step of forming the holes 30a and 30b shown in FIGS. 8A and 8D, the hole 30a of the element portion 14 and the hole 30h of the void detection monitor 16 can be formed such that both holes 30a and 30b have the same cross-sections, and accordingly, the metal portion 24 of the element portion 14 would have the same cross-section as that of the metal portion 24 of the void detection monitor 16. In this example, it can be assumed that a void 10 is formed in both the metal portions 24 of the element portion 14 and the void detection monitor 16. Accordingly, it can be accurately determined whether or not the void 10 has been formed in the metal portion 24 of the element portion 14 by detecting the existence of the void 10 in the metal portion 24 of the void detection monitor 16.

In one embodiment, each metal portion 24 of the element portion 14 and the void detection monitor 16 is formed of the via plug 32, or formed of the via plug 32 and the interconnection layer 34. In one embodiment, the metal portion 24 of the element portion 14 may be formed of the via plug 32, and the metal portion 24 of the void detection monitor 16 may be formed of the via plug 32 and the interconnection layer 34. Furthermore, the metal portion 24 of the void detection monitor 16 may includes a plurality of line widths or a plurality of cross-sections. In one embodiment, the metal portion 24 of the void detection monitor 16 preferably has a cross-section which ensures the detection of the existence of a void 10 in the metal portion 24 of the element portion 14.

Figure 12:
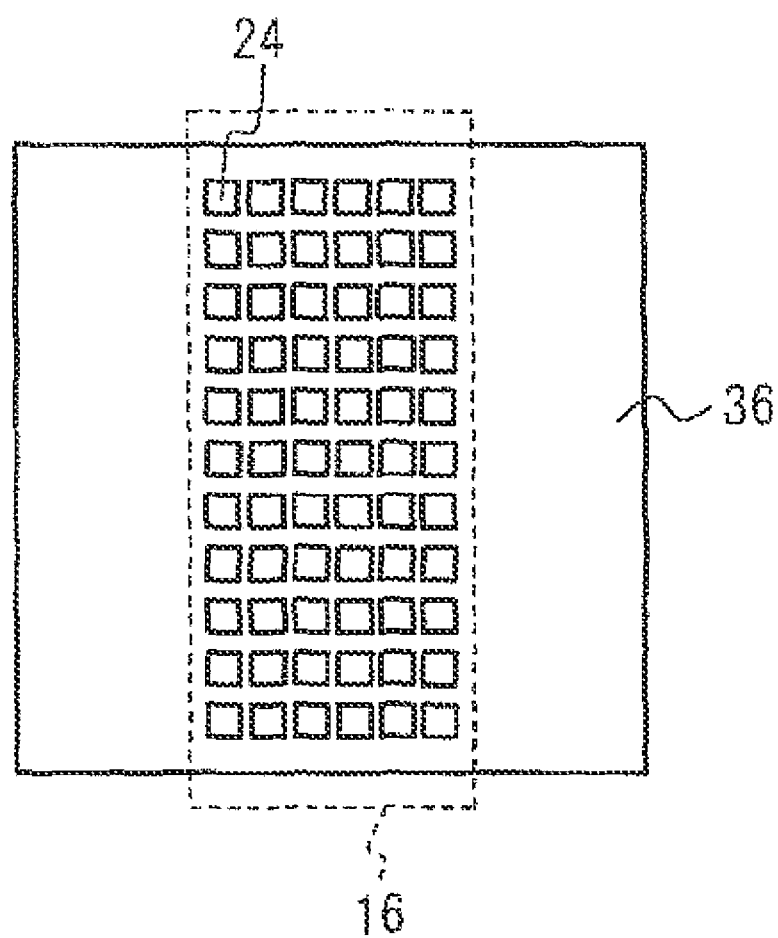
FIG. 12 is a top view showing the metal portion of the void detection monitor formed in a dotted pattern according to one embodiment.

The metal portion 24 of the void detection monitor 16 may have a line pattern such as is shown in FIGS. 4, 10A and 11A. Alternatively, it may have a dotted pattern such as is shown in FIG. 12. In the process step of forming the hole 30b in the void detection monitor 16, the hole 30b may be thrilled in a line or a dotted pattern as shown in FIG. 8D.

To summarize, one embodiment includes a method for detecting a void in an element portion of a semiconductor device having an element portion and a void detection structure. As a part of the method, an insulating film is funned on a substrate, a plurality of holes is formed in the insulating film, and a metal portion is formed on the insulating film to fill the plurality of holes. The metal portion is polished until the insulating film is exposed and a recessed portion is formed in the void detection structure. It is determined if a void exists in the element portion of the semiconductor device by determining whether or not a void is exposed at a surface of the recessed portion of the void detection structure. The method allows a void to be exposed to the surface of metal portions located in the recessed portion of the void detection structure. Various void detection methods may be used to detect whether or not the void is exposed to surface of the metal portions of the void detection structure so as to determine the existence of a void in metal portions of the element portion of the semiconductor device.

In the method described above, in the step of forming a plurality of holes, the plurality of holes are formed so that an area occupancy of a total area viewed from the top of the plurality of holes in the void detection monitor to an area viewed from the top of the void detection monitor becomes larger than that of the total area viewed from the top of the plurality of holes in the element portion to the area viewed from the top of the element portion. The dishing in the step of polishing the metal portion allows the dishing amount of the void detection monitor to be larger than that of the element portion.

In the method described above, in the step of forming a plurality of holes, the plurality of holes are formed so that each cross-section shape of the plurality of holes of the void detection monitor is the same as that of the plurality of holes of the element portion. A detection can be made whether or not the void is exposed to the metal portion surface of the void detection monitor in order to determine whether or not a void has been formed in the metal portion of the element portion more accurately.

In the method, in the step of forming a plurality of holes, the plurality of holes of the void detection monitor may be formed in a line pattern or a dotted pattern. In the method, the insulating film may include an inter-layer insulating film, and the metal portion may include a via plug. This makes it possible to provide the single damascene structure.

In the method the insulating film may include an inter-layer insulating film, and the metal portion may include an interconnection layer and a via plug. This structure facilitates the provision of a dual damascene structure. In addition, in the method, the insulating film may be formed of $SiO_2$, and the metal portion may be formed of Cu.

According to another aspect of the present invention, there is provided a semiconductor device that includes an element portion and a void detection monitor, which includes an insulating film formed on a substrate, and a plurality of metal portions each piercing through the insulating film. The void detection monitor has a dish-like recess portion, which is different from the element portion in shape. This makes it possible to use the void detection monitor for detecting whether or not the void has been formed in the metal portion of the element portion.

In the structure, an area occupancy of a total area viewed from the top of the plurality of metal portions in the void detection monitor to an area viewed from the top of the void detection monitor is larger than that of the total area viewed from the top of the plurality of metals in the element portion to the area viewed from the top of the element portion.

The invention allows the void formed inside the metal portion to be exposed to the metal portion surface of the void detection monitor. This makes it possible to determine whether or not a void has been formed in the metal portion of the element portion using various processes for detecting whether or not a void is exposed to the metal surface of the void detection monitor.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

The invention claimed is:

1. A semiconductor device comprising:
   an element portion and a void detection monitor formed on a substrate;
   an insulating film formed on the substrate; and
   a plurality of metal portions each extending through the insulating film, wherein the void detection monitor comprises the plurality of metal portions and has a dish-like recess portion and wherein the element portion has a flat surface.

2. The semiconductor device according to claim 1, wherein an area occupancy of a total area viewed from the top of a plurality of metal portions in the void detection monitor to an area viewed from the top of the void detection monitor is larger than that of the total area viewed from the top of a plurality of metal portions in the element portion to the area viewed from the top of the element portion.

3. The semiconductor device according to claim 1, wherein the insulating film comprises a plurality of holes wherein the plurality of holes are formed so that an area occupancy of a total area viewed from the top of a plurality of holes in the void detection monitor to an area viewed from the top of the void detection monitor becomes larger than that of the area viewed from the top of a plurality of holes in the element portion to the area viewed from the top of the element portion.

4. The semiconductor device according to claim 1, wherein the insulating film comprises a plurality of holes wherein the plurality of the holes are formed so that each cross-sectional shape of a plurality of holes of the void detection monitor is the same as that of a plurality of holes of the element portion.

5. The semiconductor device according to claim 1, wherein the insulating film comprises a plurality of holes wherein the plurality of holes are formed in a line pattern or a dotted pattern.

6. The semiconductor device according to claim 1, wherein the insulating film includes an inter-layer insulating film, and the metal portions include a via plug.

7. The semiconductor device according to claim 1, wherein the insulating film includes an inter-layer insulating film, and the metal portions include an interconnection layer and a via plug.

8. The semiconductor device according to claim 1, wherein the insulating film is formed of $SiO_2$, and the metal portions are formed of Cu.

9. A semiconductor device, comprising:
   a substrate;
   an insulating film formed on the substrate;
   an element portion comprising metal formed in vias in the insulating film wherein the top surface of the element portion is planar; and
   a void detection monitor comprising metal formed in vias in the insulating film, wherein the surface of the void detection monitor comprises a dish-like recess portion that facilitates the detection of voids.

10. The semiconductor device according to claim 9 wherein the element portion comprises a memory cell region and a peripheral cell region.

11. The semiconductor device according to claim 10 wherein Cu metal line patterns in the memory cell region have a Cu occupancy of less than 30 percent and Cu metal line patterns in the void detection monitor have a Cu occupancy of greater than 90 percent.

12. The semiconductor device according to claim 11 wherein the Cu metal line patterns comprise a via chain pattern.

13. The semiconductor device according to claim 11 wherein the metal line patterns in the memory cell region are dual damascene line patterns and the metal line patterns in the void detection monitor are single damascene type line patterns.

* * * * *